(12) United States Patent
Yamana et al.

(10) Patent No.: US 8,762,115 B2
(45) Date of Patent: Jun. 24, 2014

(54) SYSTEM AND METHOD FOR EVALUATING NUCLEAR REACTOR FUELING PLAN

(75) Inventors: Teppei Yamana, Kanagawa-Ken (JP); Masayuki Tojo, Kanagawa-Ken (JP); Hitoshi Sato, Kanagawa-Ken (JP); Tatsuya Iwamoto, Kanagawa-Ken (JP)

(73) Assignee: Global Nuclear Fuel—Japan Co., Ltd, Kanagawa-Ken (JP)

( * ) Notice: Subject to any disclaimer, the term of this patent is extended or adjusted under 35 U.S.C. 154(b) by 515 days.

(21) Appl. No.: 13/128,605

(22) PCT Filed: Oct. 27, 2009

(86) PCT No.: PCT/JP2009/069740
§ 371 (c)(1),
(2), (4) Date: May 10, 2011

(87) PCT Pub. No.: WO2010/053061
PCT Pub. Date: May 14, 2010

(65) Prior Publication Data
US 2011/0224966 A1    Sep. 15, 2011

(30) Foreign Application Priority Data
Nov. 10, 2008   (JP) .................................. 2008-287806

(51) Int. Cl.
*G06F 7/48*    (2006.01)
*G06F 17/50*   (2006.01)

(52) U.S. Cl.
CPC ................................. *G06F 17/5009* (2013.01)
USPC .......................................................... 703/6

(58) Field of Classification Search
USPC ...................................................... 703/2, 6–7
See application file for complete search history.

(56) References Cited

U.S. PATENT DOCUMENTS

| | | | |
|---|---|---|---|
| 7,337,099 B2 * | 2/2008 | Kropaczek et al. | 703/6 |
| 2004/0243370 A1 * | 12/2004 | Kropaczek et al. | 703/13 |
| 2005/0015227 A1 | 1/2005 | Kropaczek et al. | 703/6 |
| 2005/0089831 A1 * | 4/2005 | Russell et al. | 434/218 |
| 2007/0213959 A1 * | 9/2007 | Kropaczek et al. | 703/1 |

FOREIGN PATENT DOCUMENTS

| | | |
|---|---|---|
| JP | 03-95491 | 4/1991 |
| JP | 2005-121476 | 5/2005 |
| JP | 2007-147529 | 6/2007 |

* cited by examiner

*Primary Examiner* — Eunhee Kim
(74) *Attorney, Agent, or Firm* — Seed IP Law Group PLLC

(57) ABSTRACT

A nuclear reactor fueling plan evaluating system and method in which reactor shutdown margin evaluation are performed quickly and accurately. A fueling procedure formulating part and an input setting part having databases are included. A maximum worth control rod candidate selecting part having a control rod worth calculating means inputs fuel loading and control rod patterns of each fueling act, inputs a relatively simple second physics model, calculates control rod worth from the difference between the degree of subcriticality of a reactor core in a state that all control rods are inserted and the degree of subcriticality of the reactor core in a state that a single control rod is withdrawn for each fueling step, and selects a determined number of maximum worth control rod candidates. A reactor shutdown margin calculating part inputs a subdivided first physics model and calculates reactor shutdown margin for each maximum worth control rod candidate.

16 Claims, 7 Drawing Sheets

SYSTEM AND METHOD FOR EVALUATING NUCLEAR REACTOR FUELING PLAN

BACKGROUND

1. Technical Field

This invention relates to a system and method for evaluating the safety of fueling plans which are planned during scheduled outage etc. of a nuclear reactor.

More specifically, this invention relates to such a system and method for evaluating nuclear reactor fueling plans which can evaluate the safety, quickly and accurately, for the fueling plans in which fuel shuffling within the reactor is performed for the burned fuel, spent fuel is unloaded to be disposed of, and new fuel is loaded.

2. Description of the Related Art

In a nuclear power plant, generally a scheduled outage is performed about once a year, and at that time fuel is exchanged. There are fuel exchange methods in which: (1) all the fuel is temporarily transferred to fuel storage pool, and then the burned fuel, excluding spent fuel, and new fuel are loaded at the position according to fuel loading patterns determined by the reactor core design; or (2) spent fuel is unloaded from the reactor core, and the burned fuel is moved within the reactor and installed to preferably give a target fuel loading pattern, and then new fuel is loaded.

According to the former method (1), as the fuel is transferred to a fuel storage pool, the fuel is taken out of the reactor core, and the neutron source is in the process of decreasing accordingly, and if the design conditions ensure subcriticality of the reactor core before and after the fuel exchange, subcriticality during the fuel transfer will be ensured.

However, in this method, because the fuel is moved assembly by assembly with a refueling machine, the time required for the fueling is longer compared to the latter fuel exchange method.

According to the latter method (2) on the other hand, because the fuel to be recycled is moved within the reactor, the time required for the fueling is shorter compared to the former method (1).

In this method, however, high reactivity fuel could become concentrated locally within the reactor in a certain fueling step during the fueling, and it is thus necessary to plan fueling procedures so that the reactor core subcriticality can be ensured even if such high reactivity fuel becomes concentrated locally.

Reduction of a scheduled outage period at a nuclear power plant leads to improvement in the operating rate of the plant and is economically very important.

The latter fuel exchange method (2) is preferable in terms of reduced time taken for fueling particularly for a reactor core with a large number of fuel assemblies to be loaded, but presents problems in terms of time taken for the evaluation of reactor core subcriticality at each fueling step.

Note that generally, subcriticality of a boiling water nuclear reactor is evaluated through reactor shutdown margin calculations by a reactor core simulator. The term "reactor shutdown margin" indicates the degree of subcriticality that can be ensured even if a single control rod with maximum control rod worth, of the rods that are being inserted, is withdrawn.

A "control rod worth" of a control rod is the difference between the effective multiplication factor of a reactor core in which the control rod is being inserted and that of the reactor core from which the control rod is being withdrawn. However, a case of withdrawal of a single pair of control rods which can be withdrawn simultaneously may be considered in some cases, depending on the structure of the control rod drive mechanism. In the present application, such pair of control rods is defined as a "control rod pair".

In the present application, the term "control rod worth" not only means the control rod worth of a single control rod in a case that the single control rod is withdrawn but also includes the control rod worth of a single pair of control rods in a case that the single pair of control rods is withdrawn.

With respect to physics models of a reactor core simulator used in the current reactor core designs, there are a 3-dimensional 3-group model, a 3-dimensional modified 1-group model, a 2-dimensional 3-group model, a 2-dimensional modified 1-group model, etc.

A 3-dimensional model is a physics model that simulates a reactor core by partitioning the reactor core 3-dimensionally (xyz directions) with mesh and performing nuclear and thermal hydraulic coupling calculations.

A 3-group model is a physics model in which neutron flux is divided according to the energy conditions into thermal neutron flux, resonance region flux, and fast neutron flux, each of which provides an independent variable.

A modified 1-group model is a physics model that simulates a reactor core state by obtaining the ratio of thermal neutron flux and fast neutron flux with the fast neutron flux as an independent variable.

A 2-dimensional model is a physics model that simulates a reactor core by partitioning the reactor core, as viewed from above, 2-dimensionally (xy directions) with mesh and performing nuclear and thermal hydraulic coupling calculations. In the 2-dimensional model, however, because a reactor core which is actually 3-dimensional is summarized into 2 dimensions in a nuclear manner, accuracy can be very low in some cases.

That is, in the above physics models of a reactor core simulator, the models that can simulate a reactor core in detail are a 3-dimensional 3-group model, a 3-dimensional modified 1-group model, a 2-dimensional 3-group model, and a 2-dimensional modified one-group model in that order.

In recent years, physics models of a reactor core simulator are in the trend of further subdivision in dealing with new design fuel or mixed oxide (MOX) fuel, and much further subdivided physics models are desired to be applied also in subcriticality evaluation during fueling.

However, subdivided models require longer time for calculations as a result. A 3-dimensional model is a much further subdivided physics model and takes longer calculation time than a 2-dimensional model. Likewise a 3-group model is a much further subdivided physics model and takes longer calculation time than a modified 1-dimensional model.

When reactor shutdown margin calculations are performed for all the fueling procedures (fueling steps) in fuel exchange, the reactor core state in the target fueling step and the reactor core state in the target fueling step wherein a single or a single pair of each control rod or control rod pair which is being inserted is withdrawn from the reactor core, are calculated for all of the fueling steps. Usually the number of fueling steps for fuel exchange is as much as 1.5 times the number of fuel assemblies, and the number of control rods is as much as 0.25 times the number of fuel assemblies. Assuming that the number of fuel assemblies is 872, the number of fueling steps will be about 1,300, and the number of control rods to be inserted will be about 200, and thus the number of cases of calculations will be about 260 thousand. To calculate all the cases with 3-dimensional 3-group model, the time required for the calculations will extend over dozens of days.

However, the time period from nuclear reactor shutdown to fueling is normally as much as 3 days, allowing up to as much as 2 days for fueling procedure establishment, and reactor shutdown margin evaluation requiring dozens of days for calculation time is not acceptable.

For this reason, simple models and 2-dimensional models have been employed as subcriticality evaluation models for a fuel planning system in the conventional art.

Hereinafter explained is a rough flow of a nuclear and thermal hydraulic coupling convergence calculation method in a subcriticality evaluation by a reactor core simulator, using FIG. 7.

First, a nuclear constant is calculated from conditions such as the reactor water temperature (Step 700).

Then, a count C of iterative calculations of neutron flux is initialized to 1 (Step 701).

Then, a neutron source is calculated from given neutron flux and the nuclear constant calculated in Step 700 (Step 702). As for the given neutron flux at this point, the neutron flux that is given as an initial value is used for Step 702 for the first time after the calculations are started, otherwise the neutron flux calculated by the neutron flux calculations of the last processing (C−1) is used (Step 702).

Then, neutron flux is calculated from the neutron source calculated in Step 702 and the nuclear constant calculated in Step 700 (Step 703).

Then, whether the count C of iterative calculations of neutron flux reaches a set iteration count is judged (Step 704), and if the set iteration count is reached, output power is calculated from the neutron flux calculated in Step 703 and the nuclear constant calculated in Step 700 (Step 705).

If the count C of iterative calculations of neutron flux does not reach a set iteration count, then the count C of iterative calculations of neutron flux is added by 1 count, and the processing from Step 702 is repeated.

Then, the output power calculated this time and that calculated last time are compared, and if the convergence judgment is fulfilled, the calculations are terminated, and if not, the processing from Step 701 is performed.

BRIEF SUMMARY

In the official gazette of Japanese Patent Laid-Open Application No. 3-95491/1991, a reactor shutdown margin evaluation method, which applies to a focused control rod position surrounded by 16 bundles, is proposed as a calculation model of a subcriticality evaluation at fuel planning, but because this is not an evaluation with a subdivided model, excessive maintainability is needed to be taken, which in some cases leads to a decrease in efficiency in fueling. Additionally, because the applied physics models have a low subdivision level, there also is a problem that subcriticality during fueling being ensured is poorly explained.

In the official gazette of Japanese Patent Laid-Open Application No. 2005-121476, the art of subcriticality evaluation is proposed with a 2-dimensional 3-group model that is a further subdivided model than the one in the above official gazette of Japanese Patent Laid-Open Application No. 3-95491/1991, and the calculation accuracy is more improved than the art in the above official gazette, but still, accuracy of the calculations with a 2-dimensional model may decrease in some cases, and maintainability is needed to be taken, same as in a simple model, and efficiency in fueling is not accepted as sufficient.

As explained above, a nuclear reactor fueling plan evaluating system with a subcriticality evaluation mechanism which can perform reactor shutdown margin evaluation accurately and quickly, and the evaluation methods therewith, have never been proposed.

Given such situation, the present invention provides a nuclear reactor fueling plan evaluation system which can perform quick and accurate reactor shutdown margin evaluation of a fueling plan by means of a method in which shuffling of the burned fuel is performed in a reactor core, and new fuel is loaded in scheduled outages etc. of a nuclear reactor, and the evaluation method therewith, to solve the problems.

A fueling plan evaluating system characterized by comprising: a fueling procedure formulating part which formulates fueling procedures for fuel of a nuclear reactor; an input setting part comprising an input means, a fueling procedure database which does storage management of the fueling procedures formulated by said fueling procedure formulating part, a reactor-core-simulator-calculation nuclear-model database which stores physics models for performing calculations through reactor core simulation, and a calculation condition database which stores calculation conditions for performing control rod worth calculations or reactor shutdown margin calculations; a maximum worth control rod candidate selecting part comprising a control rod worth calculating means which inputs fuel loading and control rod patterns of each fueling step from said fueling procedure database, inputs as well a simpler second physics model, compared to a subdivided first physics model used for reactor shutdown margin calculations, from said reactor-core-simulator-calculation nuclear-model database, calculates with said second physics model, from the difference between the degree of subcriticality of a reactor core in a state that all the control rods that can be inserted are inserted and the degree of subcriticality of the reactor core in a state that a focused single control rod or single pair of control rods is withdrawn, control rod worth of said focused control rod or control rod pair for each fueling step, calculates control rod worth of said control rod or control rod pair of each of planned fueling steps, and selects a predetermined number of control rods or control rod pairs with large values of control rod worth as maximum worth control rod candidates; a reactor shutdown margin calculating part which inputs the maximum worth control rod candidates selected by said control rod worth calculating means, inputs as well a subdivided first physics model used for reactor shutdown margin calculations from said reactor-core-simulator-calculation nuclear-model database, and calculates using said first physics model, for each of the maximum worth control rod candidates, reactor shutdown margin in a case that, from the fuel loading and control rod patterns, a focused maximum worth control rod candidate is withdrawn; and an output part comprising a means for inputting the reactor shutdown margin calculated by said reactor shutdown margin calculating part and outputting or storing said reactor shutdown margin as an evaluation of a fueling plan for a nuclear reactor.

Also, A fueling plan evaluating system characterized by comprising: a fueling procedure formulating part which formulates fueling procedures for fuel of a nuclear reactor; an input setting part comprising an input means, a fueling procedure database which does storage management of the fueling procedures formulated by said fueling procedure formulating part, a reactor-core-simulator-calculation nuclear-model database which stores physics models for performing calculations through reactor core simulation, and a calculation condition database which stores calculation conditions for performing control rod worth calculations or reactor shutdown margin calculations; a maximum worth control rod candidate selecting part comprising a control rod worth calculating means which inputs fuel loading and control rod patterns of each fueling step from said fueling procedure database, inputs as well a simpler second physics model, compared to a subdivided first physics model used for reactor shutdown margin calculations, from said reactor-core-simulator-calculation nuclear-model database, calculates with said second physics model, from the difference between the degree of subcriticality of a reactor core in a state that all the control rods that can be inserted are inserted and the degree of subcriticality of the reactor core in a state that a focused single control rod or single pair of control rods is withdrawn, control rod worth of said focused control rod or control rod pair for each fueling step, calculates control rod worth of said control rod or control rod pair of a focused fueling step, and selects a predetermined number of control rods or control rod pairs with large values of control rod worth as maximum worth control rod candidates; a reactor shutdown margin calculating part which, after maximum worth control rod candidates of each fueling step are selected by said control rod worth calculating means, inputs the maximum worth control rod candidates for each fueling step, inputs as well a subdivided first physics model used for reactor shutdown margin calculations from said reactor-core-simulator-calculation nuclear-model database, and calculates using said first physics model, for the maximum worth control rod candidates of each fueling step, reactor shutdown margin in a case that, from the fuel loading and control rod patterns, a focused maximum worth control rod candidate is withdrawn; and a fueling procedure validating part which inputs the reactor shutdown margin of each fueling step calculated by said reactor shutdown margin calculating part and inputs a design target value of reactor shutdown margin from the calculation condition database and by making a comparison therebetween judges whether or not subcriticality is ensured in said each fueling step, and if subcriticality is decided not to be ensured in a fueling step, outputs request to said fueling procedure formulating part to re-formulate the fueling step or a fueling step preceding the fueling step by a predetermined number of steps.

Said maximum worth control rod candidate selecting part can be made to comprise a neutron flux initial value determining means which calculates a neutron flux initial value which is used when said control rod worth calculating means calculates control rod worth, and said neutron flux initial value determining means can be made to input a simpler third physics model compared to said first physics model from the reactor-core-simulator-calculation nuclear-model database, calculate, with said third physics model, neutron flux in a state that all control rods or all the control rods that can be inserted are inserted in each fueling step, input a further simpler fourth physics model compared to said third physics model from the reactor-core-simulator-calculation nuclear-model database, calculate, with said fourth physics model, neutron flux in a case that a focused control rod or control rod pair is withdrawn, and determine a neutron flux initial value by applying algebraic operations to the neutron flux, calculated with said third physics model, in a state that said control rods are inserted, using the neutron flux calculated with said fourth physics model.

Said calculation condition database can be made to include data of calculation conditions that if the number of fuel-loaded assemblies in a cell is 3 or less, the control rod is not subject to control rod worth calculations and that, for a control rod pair, if the number of fuel-loaded assemblies of the cell with more fuel-loaded assemblies, out of 2 cells, is 3 or less, the control rod pair is not subject to control rod worth calculations, and said control rod worth calculating means can be made to input said data of calculation conditions which are not subject to control rod worth calculations from the calculation condition database, and skip the calculations of control rod worth for said control rod or control rod pair which is not subject to the calculations of control rod worth.

Said calculation condition database can be made to include a calculation condition datum that calculations of control rod worth with said second physics model is skipped if the degree of subcriticality, calculated with said simpler fourth physics model, in a case that a focused control rod or control rod pair is withdrawn, is larger than a set degree of subcriticality, and said control rod worth calculating means can be made to input the calculation condition datum of said control rod worth calculations to be skipped from said calculation condition database, and skip the calculations of control rod worth if the degree of subcriticality calculated with said fourth physics model is larger than the set degree of subcriticality of said calculation condition datum.

Said calculation condition database can be made to include calculation condition data that operates wherein convergence judgment of the calculations of control rod worth of a control rod or control rod pair is relaxed, said control rod or control pair being in a field where a relative value of an output power is equal to or lower than a standard value, and said control rod worth calculating means can be made to input calculation condition data of convergence judgment relaxation from said calculation condition database, and relax the convergence judgment in a field where a relative value of an output power is equal to or lower than a standard value.

Said first physics model and second physics model can be a 3-dimensional 3-group model and a 3-dimensional modified 1-group model, respectively.

Said third physics model and fourth physics model can be a 3-dimensional modified 1-group model and a 2-dimensional modified 1-group model, respectively.

A fueling plan evaluating method according to the present invention is characterized by comprising the steps of: formulating fueling procedures for fuel of a nuclear reactor; inputting fuel loading and control rod patterns of each of said formulated fueling procedures; inputting as well a simpler second physics model compared to a subdivided first physics model used for reactor shutdown margin calculations; calculating with said second physics model, from the difference between the degree of subcriticality of a reactor core in a state that all the control rods that can be inserted are inserted and the degree of subcriticality of the reactor core in a state that a focused single control rod or a single pair of control rods is withdrawn, control rod worth of said focused control rod or control rod pair for each fueling step; calculating control rod worth of said control rod or control rod pair of each of the planned fueling steps; selecting a predetermined number of control rods or control rod pairs with large values of control rod worth as maximum worth control rod candidates; inputting said calculated maximum worth control rod candidates; inputting as well a subdivided first physics model used for reactor shutdown margin calculations; calculating, using said first physics model, for each of the maximum worth control rod candidates, reactor shutdown margin in a case that, from the fuel loading and control patterns, a focused maximum worth control rod candidate is withdrawn; and inputting said calculated reactor shutdown margin and outputting or storing said reactor shutdown margin as an evaluation of a fueling plan for a nuclear reactor.

Also, a fueling plan evaluating method according to the present invention is characterized by comprising the steps of: formulating fueling procedures for fuel of a nuclear reactor; inputting fuel loading and control rod patterns of each of said formulated fueling steps; inputting as well a simpler second physics model compared to a subdivided first physics model used for reactor shutdown margin calculations; calculating with said second physics model, from the difference between the degree of subcriticality of a reactor core in a state that all the control rods that can be inserted are inserted and the degree of subcriticality of the reactor core in a state that a focused single control rod or single pair of control rods is withdrawn, control rod worth of said focused control rod or control rod pair for each fueling step; calculating control rod worth of said control rod or control rod pair of a focused fueling step; selecting a predetermined number of control rods or control rod pairs with large values of control rod worth as maximum worth control rod candidates; after the maximum worth control rod candidates of said each fueling step are selected, inputting the maximum worth control rod candidates for each fueling step, inputting as well a subdivided first physics model used for reactor shutdown margin calculations; calculating using said first physics model, for the maximum worth control rod candidates of each fueling step, reactor shutdown margin in a case that, from the fuel loading and control patterns, a focused maximum worth control rod candidate is withdrawn; inputting said calculated reactor shutdown margin of each fueling step; by comparing the reactor shutdown margin to a design target value of reactor shutdown margin, judging whether or not subcriticality is ensured in said each fueling step, and if subcriticality is decided not to be ensured in a fueling step, re-formulating said fueling step or a fueling step preceding said fueling step by a predetermined number of steps.

Before the step of calculating control rod worth of said each control rod or control rod pair, the steps can be comprised of: inputting a simpler third physics model compared to said first physics model and calculating with said third physics model neutron flux in a state that all control rods or all the control rods that can be inserted are inserted in each fueling step; inputting a further simpler fourth physics model compared to said third physics model and calculating with said fourth physics model neutron flux in a case that a focused control rod or control rod pair is withdrawn; and determining a neutron flux initial value by applying algebraic operations to the neutron flux, calculated with said third physics model, in a state that said control rods are inserted, using the neutron flux calculated with said fourth physics model.

The steps can be comprised of preparing data of calculation conditions that if the number of fuel-loaded assemblies in a cell is 3 or less, the control rod is not subject to control rod worth calculations and that, for a control rod pair, if the number of fuel-loaded assemblies of the cell with more fuel-loaded assemblies, out of 2 cells, is 3 or less, the control rod pair is not subject to control rod worth calculations; and in said step of calculating control rod worth and selecting maximum worth control rod candidates, inputting said data of calculation conditions which are not subject to control rod worth calculations can be input, and the calculations of control rod worth for said control rod or control rod pair which is not subject to the calculations of control rod worth can be skipped.

The steps can be comprised of preparing a calculation condition datum that the control rod worth calculated with said second physics model is skipped if the degree of subcriticality, calculated with said simpler fourth physics model, in a case that a focused control rod or control rod pair is withdrawn, is larger than a set degree of subcriticality; and in said step of calculating control rod worth and selecting maximum worth control rod candidates, the calculation condition datum of said control rod worth calculations to be skipped can be input, and the control rod worth calculations can be skipped if the degree of subcriticality calculated with said fourth physics model is larger than the set degree of said calculation condition datum.

The steps can be comprised of preparing calculation condition data that convergence judgment of the calculations of control rod worth of a control rod or control rod pair is relaxed, said control rod or control pair being in a field where a relative value of an output power is equal to or lower than a standard value, and in said step of calculating control rod worth and selecting maximum worth control rod candidates, the calculation condition data of said convergence judgment relaxation can be input, and for a control rod or a control rod pair, in a field where a relative value of an output power is equal to or lower than a standard value, satisfying said conditions, the convergence judgment of control rod worth can be relaxed.

Said first physics model and second physics model can be a 3-dimensional 3-group model and a 3-dimensional modified 1-group model, respectively.

Said third physics model and fourth physics model can be a 3-dimensional modified 1-group model and a 2-dimensional modified 1-group model, respectively.

In the fueling plan evaluating system and the evaluation method therewith, fueling procedures are formulated, a simpler second physics model compared to a subdivided first physics model used finally for reactor shutdown margin calculations is input, from the difference between the degree of subcriticality of a reactor core in a state that all the control rods that can be inserted are inserted and the degree of subcriticality of the reactor core in a state that a focused single control rod or a single pair of control rods is withdrawn, control rod worth of the focused control rod or control rod pair for each fueling step is calculated with the second physics model, control rod worth of the control rod or control rod pair of each fueling step is calculated, a predetermined number of control rods or control rod pairs with large values of control rod worth is selected as maximum worth control rod candidates, and, for each maximum worth control rod candidate, reactor shutdown margin calculations are performed with a subdivided first model. The maximum worth control rod candidate can be a control rod pair.

In this way, reactor shutdown margin calculations with a subdivided physics model are not necessary to be performed for all the control rod withdrawal but only to calculate reactor shutdown margin for the maximum worth control rod candidates, and thus the reactor shutdown margin calculation time can be reduced.

Moreover, according to the present invention, because calculations are done with a simpler second physics model, compared to a subdivided first physics model used for reactor shutdown margin calculations, in selecting the maximum worth control rod candidates, the calculation time for selecting the maximum worth control rod candidates is reduced. By using the simple second physics model, accuracy becomes lower than the calculations with a first physics model, but since the second physics model is used for selecting the maximum worth control rod candidates and the subdivided first physics model is used for the final reactor shutdown margin calculations, sufficient accuracy can be ensured for the evaluation of fueling plans.

In this say, a quick and accurate evaluation of a fueling plan can be realized according to the present invention.

According to a different embodiment of the fueling plan evaluating system and the evaluation method therewith of the present invention, control rod worth of all the control rods or control rod pairs that can be inserted in each fueling step is calculated, a predetermined number of control rods or control rod pairs with large values of control rod worth is selected as maximum worth control rod candidates, reactor shutdown margin is calculated for each fueling step, whether or not subcriticality is ensured in a fueling step is judged by making a comparison between the calculated reactor shutdown margin of each fueling step and a set target value, and if subcriticality is decided not to be ensured in a fueling step, a fueling step preceding the fueling step by at least several steps is re-formulated.

If subcriticality of a predetermined fueling step M is not ensured, the fueling step cannot be employed, and thus the inefficiency of calculating the reactor shutdown margin of M+1 and the subsequent fueling steps thereto can be eliminated.

Moreover, since subcriticality of the fueling step M and the fueling steps therebefore is ensured, the previous fueling procedures are not wasted.

According to the above different embodiment of the fueling plan evaluating system and the evaluation method therewith, in addition to the effect of the case that maximum worth control rod candidates are selected with a second physics model and reactor shutdown margin for the selected maximum worth control rod candidates is calculated with a first physics model, inefficiency of calculating reactor shutdown margin of M+1 and the subsequent fueling steps thereto can be eliminated, and also the fueling step M and the fueling steps therebefore can be utilized, and thus further reduction of the calculation time can be achieved.

According to another embodiment of the present invention, in calculations of maximum worth control rod candidates in a focused fueling step, neutron flux in a state that all control rods are inserted is calculated with a simpler third physics model compared to a first physics model, neutron flux in a state that each control rod or control rod pair is withdrawn is further calculated with a further simpler fourth physics model compared to the third physics model, and, by applying algebraic operations to the neutron flux in a state that all control rods are inserted, using the calculated neutron flux, with the fourth physics model, in a state that a control rod or pair of control rods is withdrawn, a neutron flux initial value of the calculations of the maximum worth control rod candidates is provided.

With the same methodology, the present invention also includes within the range thereof a specification in which an output power distribution is provided as an initial value instead of a neutron flux initial value or both neutron flux and output power distribution are provided as initial values.

Because the fourth physics model is relatively the simplest physics model, the time for calculating neutron flux in a state that a control rod or a pair of control rods is withdrawn is reduced. Because the fourth physics model is relatively the simplest physics model, accuracy of the calculations of neutron flux in a state that a control rod or a pair of control rods is withdrawn is not high, but it is high enough to evaluate the level of influence on the neutron flux in a case that a control rod or a pair of control rods is withdrawn, and by calculating such neutron flux and applying algebraic operations to the neutron flux in a state that all control rods are inserted, adequate neutron flux initial values can be calculated. Moreover, because the calculations are done with the second physics model using control rod worth, there is no influence on control rod worth.

The calculations of control rods are significantly reduced with adequate neutron flux initial values provided, thereby reducing the time for selecting maximum worth control rod candidates.

According to another embodiment of the present invention, a case that the number of fuel-loaded assemblies in a cell is 3 or less, or for a control rod pair, a case that the number of fuel-loaded assemblies of the cell with more fuel-loaded assemblies, out of 2 cells, is 3 or less, is eliminated from the subject of the control rod worth calculations.

The control rods which satisfy those calculation conditions are eliminated from the subject of the calculations of control rod worth because the reactor shutdown margin critical point is not reached by withdrawal of such control rods.

By eliminating such control rods from the subject of the calculations of control rod worth, the time for calculating control rod worth is reduced, and, without any influence on the evaluation of reactor shutdown margin, proper reactor shutdown margin evaluation can also be performed.

According to another embodiment of the present invention, in the process of the calculations of neutron flux initial values, if the degree of reactor subcriticality in a case that a focused control rod or a pair of control rods calculated with the above simple fourth physics model is larger than a set degree of subcriticality, the calculations of control rod worth with the above second physics model is skipped.

That is, even though the fourth physics model is relatively the simplest physics model, the model can evaluate to some extent a state in which a single control rod is withdrawn. For this reason, if the degree of reactor subcriticality in a case that a predetermined control rod is withdrawn is larger than a set degree of subcriticality that sufficient margin is anticipated, it can be considered with sufficient accuracy that the reactor shutdown margin critical point is not reached by withdrawal of the control rod.

Consequently, by eliminating such control rod from the subject of the calculations of control rod worth, the calculation time is reduced, and also proper reactor shutdown margin evaluation can be performed.

According to another embodiment of the present invention, the convergence judgment of the calculations of control rod worth of control rods in a field where a relative value of an output power is equal to or lower than a standard value is relaxed.

Generally, a low-power field shows poorer convergence in convergence calculations by a reactor core simulator with the level of improvement of the calculations this time smaller compared to the last calculations. On the other hand, what is important in control rod worth calculations is the high-power field where a control rod or a pair of control rods is withdrawn while the low-power field where control rods are inserted make little contributions.

For this reason, by relaxing the convergence judgment in a field where a relative value of an output power is equal to or lower than a standard value, the convergence calculations for a low-power field are reduced, and also, even though the conditions of convergence judgment is relaxed, control rod worth and reactor shutdown margin evaluations can be performed with high enough accuracy.

As explained above, in any embodiment of the present invention, reduction of the calculation time can be achieved, and also the evaluation of reactor shutdown margin for a fueling plan can be performed with high enough accuracy.

DETAILED DESCRIPTION

Next, the best embodiments for realizing the invention will be described below.

Figure 1:
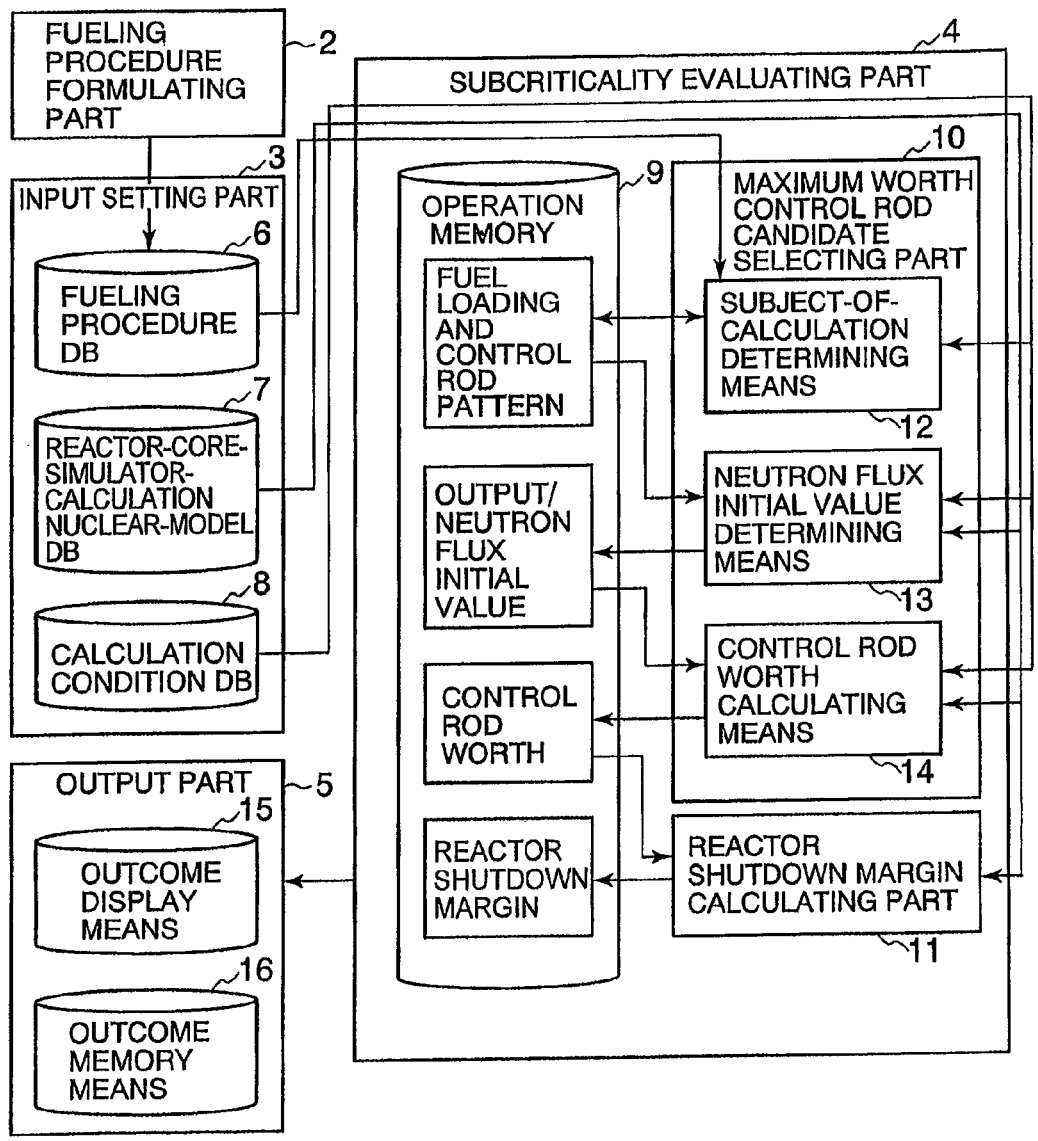
FIG. 1 is a system block diagram of a fueling plan evaluating system according to an embodiment of the present invention.

FIG. 1 shows a constitution of a nuclear reactor fueling plan evaluating system according to a first embodiment of the present invention.

A fueling plan evaluating system 1 according to the present embodiment comprises a fueling procedure formulating part 2, an input setting part 3, a subcriticality evaluating part 4, and an output part 5.

The fueling procedure formulating part 2 is a processing block for formulating and planning fueling procedures. Several fueling procedure formulating parts 2 have been proposed earlier before application of the present invention, and, in the present invention, any given art publicly known to those skilled in the art can be used.

The input setting part 3 is a processing block for inputting and setting various values and conditions for calculations of reactor shutdown margin levels.

The subcriticality evaluating part 4 is a processing block for evaluating (calculating) subcriticality of a reactor core in each fueling step. At this point, a subcriticality evaluation of a reactor core is the evaluation of a reactor core in each step of the fueling procedures by a reactor shutdown margin, which represents a degree of subcriticality of a reactor core with a maximum worth control rod being withdrawn. In this connection, there are cases that a single control rod is withdrawn and that a single control rod pair is withdrawn, and regarding a maximum worth control rod, there is a case of a control rod in which a single rod is withdrawn and a case of a control rod pair in which a single pair of rods is withdrawn. A control rod worth of a control rod is, as described above, the difference between the effective multiplication factor of a reactor core in which the control rod is being inserted and that of the reactor core from which the control rod or pair of control rods is being withdrawn.

The output part 5 is a processing block for displaying, outputting, or storing the results of the subcriticality evaluation by the subcriticality evaluating part 4.

Each of the above parts further comprises therewithin a means for specific processing as follows.

The input setting part 3 comprises, in addition to an input means which is not shown in the drawings, a plurality of databases for doing storage management of data which are input or set by the above input means, herein provided as a fueling procedure database 6 [database is abbreviated to "DB" in the drawings; the same hereinafter.], a reactor-core-simulator-calculation nuclear-model database 7 and a calculation condition database 8.

The fueling procedure database 6 is a database for doing storage management of the fueling procedures formulated by the fueling procedure formulating part 2.

The reactor-core-simulator-calculation nuclear-model database 7 is a database for doing storage management of physics models used when simulating reactor core state with a reactor core simulator. In this connection, the physics models of a reactor core are a 2-dimensional model and a 3-dimensional model, a 3-group model and a modified 1-group model of neutron flux, and the combinations thereof, for example.

The calculation condition database 8 stores: the condition data for judging whether or not a fueling step is subject to reactor shutdown margin calculations; the condition data for judging whether or not a control rod is subject to control rod worth calculations; the values with respect to the mean values of output power excluded from the convergence judgment in convergence calculations of neutron flux; the number of maximum worth control rod candidates, etc.

In other words, the calculation condition database 8 is a database for doing storage management of calculation conditions for reducing calculation time, e.g., conditions of whether a fueling step is subject to reactor core calculations, conditions for excluding a predetermined control rod from targeted control rod worth, conditions for calculations to judge a state of a certain level of convergence in a simulation as having converged, etc. The calculation condition database 8 can be provided as a so-called knowledge database.

The subcriticality evaluating part 4 further comprises therewithin an operation memory 9, a maximum worth control rod candidate selecting part 10, and a reactor shutdown margin calculating part 11.

The operation memory 9 is a means for temporarily storing data for processing of maximum worth control rod candidate selection and subcriticality evaluation. Items to be stored include fuel loading and control rod patterns, initial values of output power/neutron flux, reactor shutdown margin, etc.

The maximum worth control rod candidate selecting part 10 is a means for selecting maximum worth control rod candidates to do simulations with subdivided physics models finally in the reactor shutdown margin calculating part 11.

The maximum worth control rod candidate selecting part 10 selects maximum worth control rod candidates utilizing simple physics models, and makes the reactor shutdown margin calculating part 11 calculate the reactor shutdown margin finally with subdivided physics models. The simple models are utilized for calculations of the initial values of neutron flux for the selection of maximum worth control rod candidates so that the control rod worth calculation time can be reduced and the control rod worth calculations can be performed correctly.

In essence, the maximum worth control rod candidate selecting part 10 narrows down the control rods subject to control rod worth calculations through subdivided 3-dimensional 3-group model calculations by the reactor shutdown margin calculating part 11 to reduce the total calculation time.

The reactor shutdown margin calculating part 11 is a means for simulating/evaluating with subdivided physics models, for each candidate for the maximum worth control rod(s) selected by the maximum worth control rod candidate selecting part 10, the degree of subcriticality of a reactor core from which said maximum worth control rod candidate is being withdrawn.

The maximum worth control rod candidate selecting part 10 comprises therewithin a subject-of-calculation determining means 12, a neutron flux initial value determining means 13, and a control rod worth calculating means 14.

Of all the fueling steps, there are some steps in which the reactor shutdown margin of a reactor core after a fueling obviously increases compared to the reactor core before the fueling, and the subject-of-calculation determining means 12 is a means for eliminating such fueling steps from the calculations in the first place to narrow down to the fueling steps that are worth reviewing.

The neutron flux initial value determining means 13 is a means for determining neutron flux initial values upon doing simulation with moderately subdivided physics models for fueling steps that are determined as subject of calculations by the subject-of-calculation determining means 12.

When calculating control rod worth, the speed of the calculations to converge varies greatly depending on what neutron flux distribution is given at the beginning of the calculations. The neutron flux initial value determining means 13 is a means for reducing the calculations in the control rod worth calculating means 14 by determining a neutron flux initial value which is close to the neutron flux expected to converge and giving the value to the control rod worth calculating means 14.

The control rod worth calculating means 14 is a means for obtaining neutron flux initial values from said neutron flux initial value determining means 13 and calculating control rods with moderately subdivided physics models for fueling steps that are determined as subject of calculations by the subject-of-calculation determining means 12.

The output part 5 comprises an outcome display means 15 and an outcome memory means 16.

The foregoing is the description about the constituents constituting the fueling plan evaluating system 1, and a flow of processing by each constituent will be described below.

Figure 2:
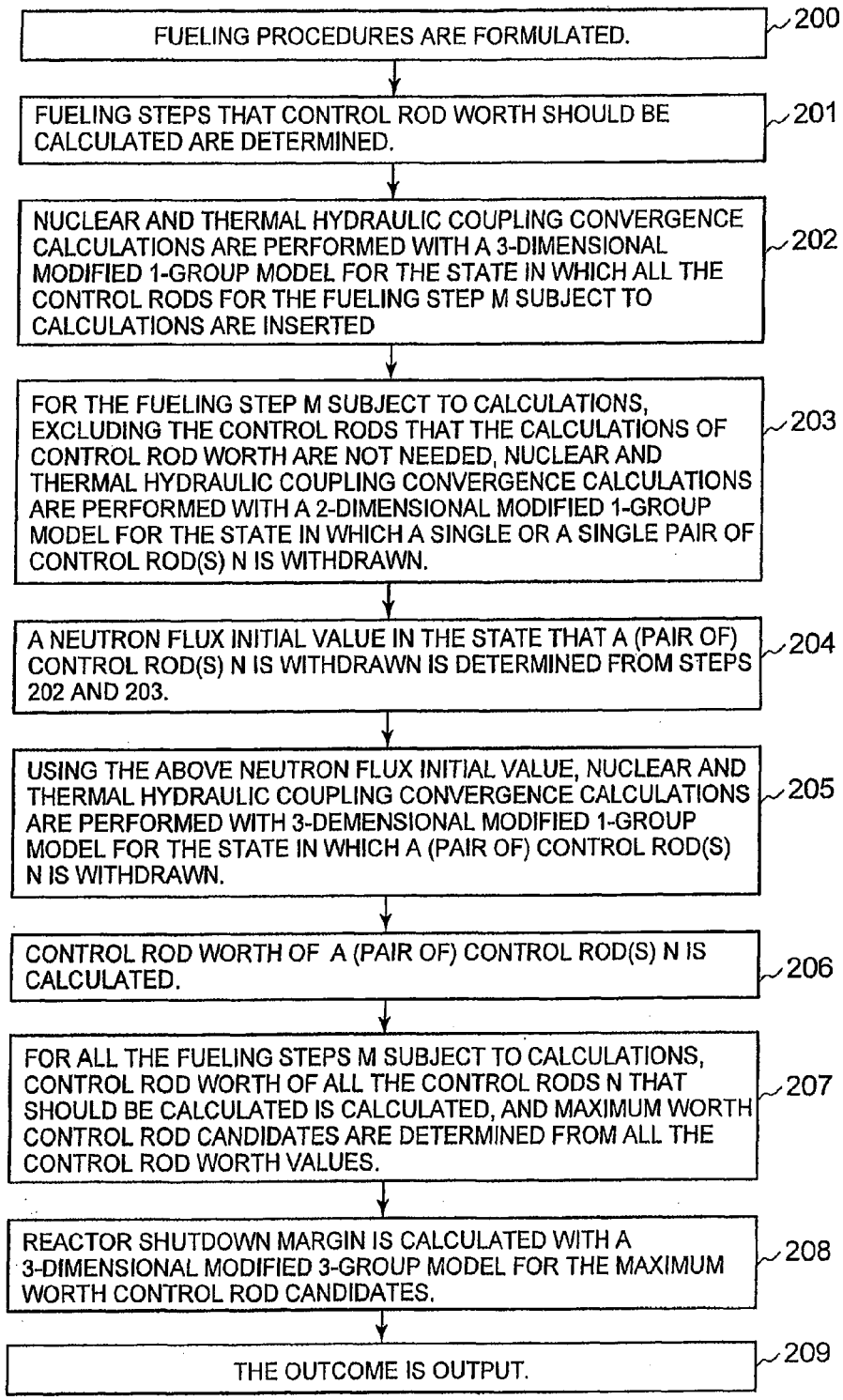
FIG. 2 is a flow chart showing a flow of processing in a fueling plan evaluating method according to an embodiment of the present invention.

FIG. 2 shows a flow of a nuclear reactor fueling plan evaluating method according to the present invention. Each constituent of the fueling plan evaluating system 1 performs processing consistent with this nuclear reactor fueling plan evaluating method to perform the evaluation of fueling plans.

In further summary of the fueling plan evaluating method in FIG. 2, the fueling plan evaluating method according to the present invention comprises the steps of: reducing the number of the fueling steps for which control rod worth is calculated (Step 201); next, calculating with the calculating method in which the calculation time is reduced for the fueling steps subject to calculations, i.e., calculating, with a simple physics model, a neutron flux initial value in a state that a predetermined control rod or a control rod pair is being withdrawn; calculating control rod worth of said predetermined control rod or control rod pair using said neutron flux initial value; determining maximum worth control rod candidates (Steps 202-207); and finally calculating, with a subdivided physics model, the reactor shutdown margin for each maximum worth control rod candidate in a case that such candidate is withdrawn (Step 208).

The nuclear reactor fueling plan evaluating method according to the present invention will be hereinafter described using each constituent of the fueling plan evaluating system 1 in line with the flow in FIG. 2.

Together with the block diagram of FIG. 1 as a reference, it can probably be understood more easily.

In the fueling plan evaluating method according to the present invention, fueling procedures are formulated in the first place (Step 200). This formulation can be performed by the fueling procedure formulating part 2.

Next, in the fueling plan evaluating method according to the present invention, the fueling steps for which reactor shutdown margin is calculated are determined out of the fueling steps (Step 201).

Such processing of determining the fueling steps for which control rod worth should be calculated is performed by excluding the fueling steps for which calculations are not necessarily done in light of the conditions for such steps, and such conditions are obtained by the subject-of-calculation determining means 12 from the calculation condition database 8.

The calculation condition database 8 stores various rules for the fueling steps for which calculations are not necessarily done (condition data). For example, in the operation of a fueling step M, the calculation condition database 8 stores a case of the destination of the fueling being out of the reactor core, a case of control rod withdrawal having no influence on the reactivity, a case of the operation being a blade guide operation, etc.

With the case of the destination of the fueling being out of the reactor core, it is known that by taking fuel out of a reactor core the neutron source decreases, and the neutron flux importance decreases due to the increase of leakage and absorption rather than the fact that thermal-group neutron flux increases due to the moderation effect, and the effective multiplication factor of the reactor core monotonously decreases to increase the reactor shutdown margin. Additionally, there are not more than 2 fuel assemblies around the control rod at a blade guide loading position, and it is also known that displacement of blade guides does not contribute to the increase of the effective multiplication factor of a reactor core.

Besides obtaining the above condition data from the calculation condition database 8, the subject-of-calculation determining means 12 inputs the fuel loading and control rod patterns of each fueling step from the fueling procedure database 6, temporarily stores the input in the operation memory 9, analyzes what operation the fuel operation of each fueling step is, compares the results to the condition data stored in the calculation condition database 8, and excludes the fueling steps that calculations are not needed from the subject of calculations (Step 201).

Due to the processing of this Step 201, the number of the fueling steps that should be reviewed is reduced, and thus the evaluation time of fuel planning is reduced.

Then, in the fueling plan evaluating method of the present invention, for each fueling step subject to calculations, a comparison of the degrees of subcriticality is made between the state in which all the control rods are inserted and the state in which a single control rod of respective control rods or a single control rod pair of respective control rod pairs is withdrawn, thereby calculating the control rod worth of a predetermined control rod or control rod pair.

The above calculations of control rod worth are performed in the Steps 202-207 in FIG. 2.

First, in Step 202, a predetermined fueling step M subject to calculations is focused on, and calculations are performed with a moderately subdivided 3-dimensional modified 1-group model for the state in which all the control rods that can be inserted for the fueling step M are inserted.

The accuracy of a 3-dimensional modified 1-group model is lower compared to a 3-dimensional 3-group model, but the calculation time is shorter and, for the purpose of control rod worth calculations, precise enough calculation results can also be obtained.

The calculations in Step 202 are performed by the control rod worth calculating means 14.

The control rod worth calculating means 14 inputs the fuel loading and control rod patterns of the fueling step M subject to be calculated from the operation memory 9 on the one hand, inputs a 3-dimensional modified 1-group model from the reactor-core-simulator-calculation nuclear-model database 7 on the other hand, and the reactor core state in which all the control rods are inserted in the fueling step M are calculated with a 3-dimensional modified 1-group model.

Then, in the fueling plan evaluating method of the present invention, for the fueling step M subject to calculations, the control rods that the calculations of control rod worth are not needed are excluded in order to reduce the calculation time of control rod worth, and in order to calculate neutron flux initial values for the calculations of the control rods that the worth calculations are needed, the state in which a focused control rod or pair of focused control rods N is withdrawn is calculated with a 2-dimensional modified 1-group model (Step 203). Note that the control rod N includes a control rod pair.

The judgment of the control rods that control rod worth is not needed to be calculated is performed according to the condition data stored in the calculation condition database 8.

As a judgment condition for a control rod that control rod worth is not needed to be calculated, for example, the calculation condition database 8 stores a condition datum that in a case that the number of fuel-loaded assemblies in a cell is 3 or less, the control rod N is not subject to the control rod worth calculations. With 3 assemblies or less, it is obvious that the degree of subcriticality is low enough. For taking a control rod pair into consideration, the calculation condition database 8 is made to store the condition datum that if the number of fuel-loaded assemblies of the cell with more fuel-loaded assemblies, out of 2 cells, is 3 or less, the control rod pair N is not subject to the control rod worth calculations.

The above processing of excluding the control rods that control rod worth is not needed to be calculated is performed in such a way that the neutron flux initial value determining means 13 inputs the fuel loading and control rod patterns from the operation memory 9 on the one hand, inputs the condition data that control rod worth is not needed to be calculated from the calculation condition database 8 on the other hand, and excludes from the calculations the control rods that satisfy the conditions.

This exclusion of control rods that calculations are not necessarily done reduces the number of the control rods that control rod worth should be calculated, and thereby reducing the evaluation time of fuel planning.

As for the control rods that worth should be calculated, the state in which such rods are being withdrawn is calculated with a 3-dimensional modified 1-group model, and in order to reduce the calculations, it is effective to give a neutron flux initial value that is close to the neutron flux expected to converge.

In the fueling plan evaluating method according to the present invention, accordingly, as for a control rod N that control rod worth is needed to be calculated, the state in which only the single rod is being withdrawn is calculated with a 2-dimensional modified 1-group model (Step 203), and a neutron flux initial value is determined from the reactor core state calculated in Step 202 in which all the control rods are being inserted and from the reactor core state calculated in Step 203 in which only the single control rod N is being withdrawn (Step 204).

In other words, the degree of influence of a case that only a single control rod (or a single pair of control rods) N is being withdrawn is calculated in Step 203, and the calculated is reflected in the reactor core state calculated in Step 202 in which all the control rods are being inserted.

To be more precise, the neutron flux initial value is the value provided as a product of the neutron flux, calculated with a 3-dimensional modified 1-group model in Step 202, multiplied by a normalized flux of neutron, and calculated with a 2-dimensional modified 1-group model in Step 203.

Because the degree of influence of a case that only a single control rod (or a single pair of control rods) N that calculations are needed is being withdrawn is calculated with a simple 2-dimensional modified 1-group model, the calculation time can be reduced.

In addition, because the calculation results are used simply for determining an initial value of neutron flux, and the worth calculations of a control rod or a pair of control rods N are done with a 3-dimensional modified 1-group model, the control rod worth calculation accuracy will not be impaired.

The above processing of determining a neutron flux initial value is performed in such a way that the neutron flux initial value determining means 13 inputs the fuel loading and control rod patterns of a fueling step M from the operation memory 9, and inputs a 2-dimensional modified 1-group model from the reactor-core-simulator-calculation nuclear-model database 7, and calculates with the 2-dimensional modified 1-group model the state in which the control rod or a pair of control rods N is being withdrawn. The neutron flux initial value determining means 13 calculates a neutron flux initial value thereafter, and said value is stored in the operation memory 9.

In the fueling plan evaluating method according to the present invention, in order to select maximum worth control rod candidates, the degree of subcriticality of a reactor core, in a state that only a single control rod (or a single pair of control rods) N is being withdrawn, is calculated with a 3-dimensional modified 1-group model using the above calculated neutron flux initial value (Step 205).

In this connection, the fueling plan evaluating method according to the present invention exercises ingenuity by reducing the calculation time also for the above reactor core calculations, with a 3-dimensional modified 1-group model, of the state in which only a single control rod (or a single pair of control rods) N is being withdrawn. The ingenuity in reducing the calculation time will be described at this point.

First, in a case that, as a result of the calculations with a 2-dimensional modified 1-group model, the degree of subcriticality of a reactor core in a state that a control rod or a pair of control rods N is being withdrawn is larger than a set degree of subcriticality that sufficient maintainability is anticipated, the calculations with a 3-dimensional modified 1-group model are skipped. That is to say, a control rod or a pair of control rods N that adjacent fuel is taken out and a control rod or a pair of control rods N that can be decided by a 2-dimensional calculations that the degree of subcriticality is large enough are excluded from the 3-dimensional modified 1-group calculations to reduce the calculation time.

Additionally, in a case that the 3-dimensional modified 1-group calculations are performed, the calculation time reduction is also achieved by relaxing the convergence conditions.

That is, the convergence judgment is relaxed for the mesh points with the relative value of the output power equal to or lower than a standard value in convergence judgment of the calculations with a 3-dimensional modified 1-group model, in consideration of the facts that in a reactor core at shutdown the output power in the field where a control rod is withdrawn is much higher than that in the field where the other control rods are inserted, and the influence on control rod worth in the low-power field where control rods are inserted is very small, and that, in convergence calculations with a reactor core simulator, generally a low-power field shows poorer convergence than a high-power field. By relaxing the convergence judgment of a low-power part where control rods that make little contribution to the control rod worth calculations are inserted in this way, the calculation time can be substantially reduced without reducing accuracy of the calculations.

The above calculations with a 3-dimensional modified 1-group model are performed in such a way that the control rod worth calculating means 14 inputs fuel loading and control rod patterns and a neutron flux initial value from the operation memory 9 and as well inputs a 3-dimensional modified 1-group model from the reactor-core-simulator-calculation nuclear-model database 7, and, with those that are input, calculates the reactor core state in which a control rod or a pair of control rods N is being withdrawn.

In this case, for the calculation time reduction as described above, the control rod worth calculating means 14 further inputs a set degree of subcriticality wherein maintainability is anticipated and the relaxation conditions of convergence judgment from the calculation condition database 8, and with these conditions, the calculation time with a 3-dimensional modified 1-group model can be reduced.

Then, in the fueling plan evaluating method according to the present invention, a comparison is made, for a fueling step M, between the degree of subcriticality, calculated in Step 202, of a reactor core in a state that all the control rods are being inserted and the degree of subcriticality, calculated in Step 205, of a reactor core in a state that only a single control rod (or a single pair of control rods) N is being withdrawn, and with the difference, the control rod worth of the control rod or pair of control rods N is calculated (Step 206).

The above control rod worth is processed by the control rod worth calculating means 14, and the control rod worth calculated by the control rod worth calculating means 14 is stored in the operation memory 9.

As described above, in the fueling plan evaluating method according to the present invention, control rod worth is calculated for all the fueling steps M subject to calculations and also for all the control rods N that should be calculated in each fueling step, and maximum worth control rod candidates are determined from all the control rod worth values (Step 207).

The above determination of maximum worth control rod candidates is performed by the control rod worth calculating means 14 where the control rod worth calculating means 14 inputs the number of maximum worth control rod candidates from the calculation condition database 8 and decides maximum worth control rod candidates accordingly.

And finally, in the fueling plan evaluating method according to the present invention, reactor shutdown margin is calculated with a subdivided 3-dimensional 3-group model for the maximum worth control rod candidates, and, based on the reactor shutdown margin in a case that a maximum worth control rod or pair of maximum worth control rods is withdrawn, the fueling plan is evaluated (Step 208).

The evaluations of the reactor shutdown margin, calculated as above, in a case that a maximum worth control rod or pair of maximum worth control rods is withdrawn and other evaluations for fueling plans are output (display and memory) in an easy-to-understand form (Step 209).

The above output of the calculation results are performed by the outcome display means 15 and outcome memory means 16 of the output part 5.

Figure 3:
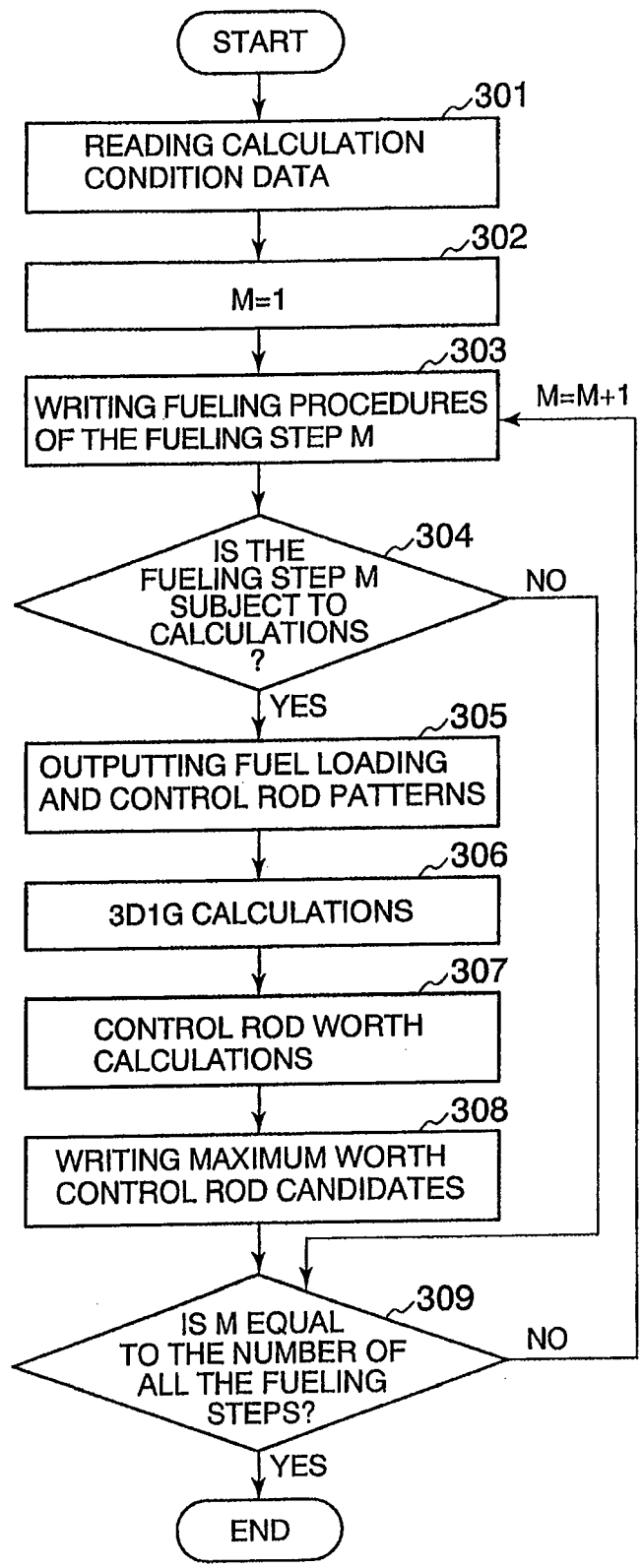
FIG. 3 is a flow chart for performing calculations to select maximum worth control rod candidates for all fueling steps M.

FIG. 3 shows a flow chart for calculating control rod worth for all the fueling steps. Brief descriptions follow.

As shown in FIG. 3, in the fueling plan evaluating method according to the present invention, first, the calculation condition data from the calculation condition database 8 are read (Step 301).

Then, a count of a fueling step number M is set to 1 (Step 302).

Then, the fueling procedures of a fueling step M from the fueling procedure database 6 are read (Step 303).

Then, in the fueling plan evaluating method according to the present invention, whether the fueling step M is subject to reactor shutdown margin calculations is determined based on the calculation condition data (Step 304). In the present embodiment, a case of the destination of the fueling being out of the reactor core, a case of control rod withdrawal, and a case of the operation being a blade guide operation are not judged as a subject of reactor shutdown margin calculations, and any other operation cases are judged as a subject of reactor shutdown margin calculations.

In a case that the fueling step M is judged as a subject of reactor shutdown margin calculations (Yes), the fuel loading/control rod patterns are output to the operation memory 9 (Step 305), and the reactor core state of the fueling step M is calculated with a 3-dimensional modified 1-group model (Step 306). Note that convergence calculations are performed with the same physics model for a reactor core state in which all the control rods adjacent to fuels are being inserted and a reactor core state in which a single control rod or a single pair of control rods is withdrawn, and, in terms of accuracy and time, it is preferable to employ 3-dimensional modified 1-group model calculations. The calculations with a 3-dimensional modified 1-group model to calculate a reactor core state in which all the control rods are being inserted are performed only once per single fueling step.

Following Step 306, control rod worth calculations of the fueling step M are performed (Step 307).

According to the results of Step 307, several or several pairs of the highest-ranked control rod worth are selected as maximum worth control rod candidates (Step 308), and whether the fueling step M being calculated at the time is equal to the number of all the fueling steps is judged (Step 309).

In Step 304, in a case that the fueling step M is judged as not a subject of reactor shutdown margin calculations (No), Steps 305-308 are skipped, and whether the fueling step M being calculated at the time is equal to the number of all the fueling steps is judged (Step 309).

In Step 309, in a case that the fueling step M being calculated at the time is judged equal to the number of all the fueling steps (Yes), the calculations are terminated, and in a case that the fueling step M being calculated at the time is judged not equal to the number of all the fueling steps (No), M is added by 1, and the calculations of the next fueling step are performed back in Step 303.

As shown in the above description and FIG. 3, the fueling plan evaluating method according to the present invention decides whether control rod worth is needed to be calculated for all the fueling steps and excludes the steps that are not needed to be calculated from the subject of calculations, thereby achieving reduction of the total calculation time.

Figure 4:
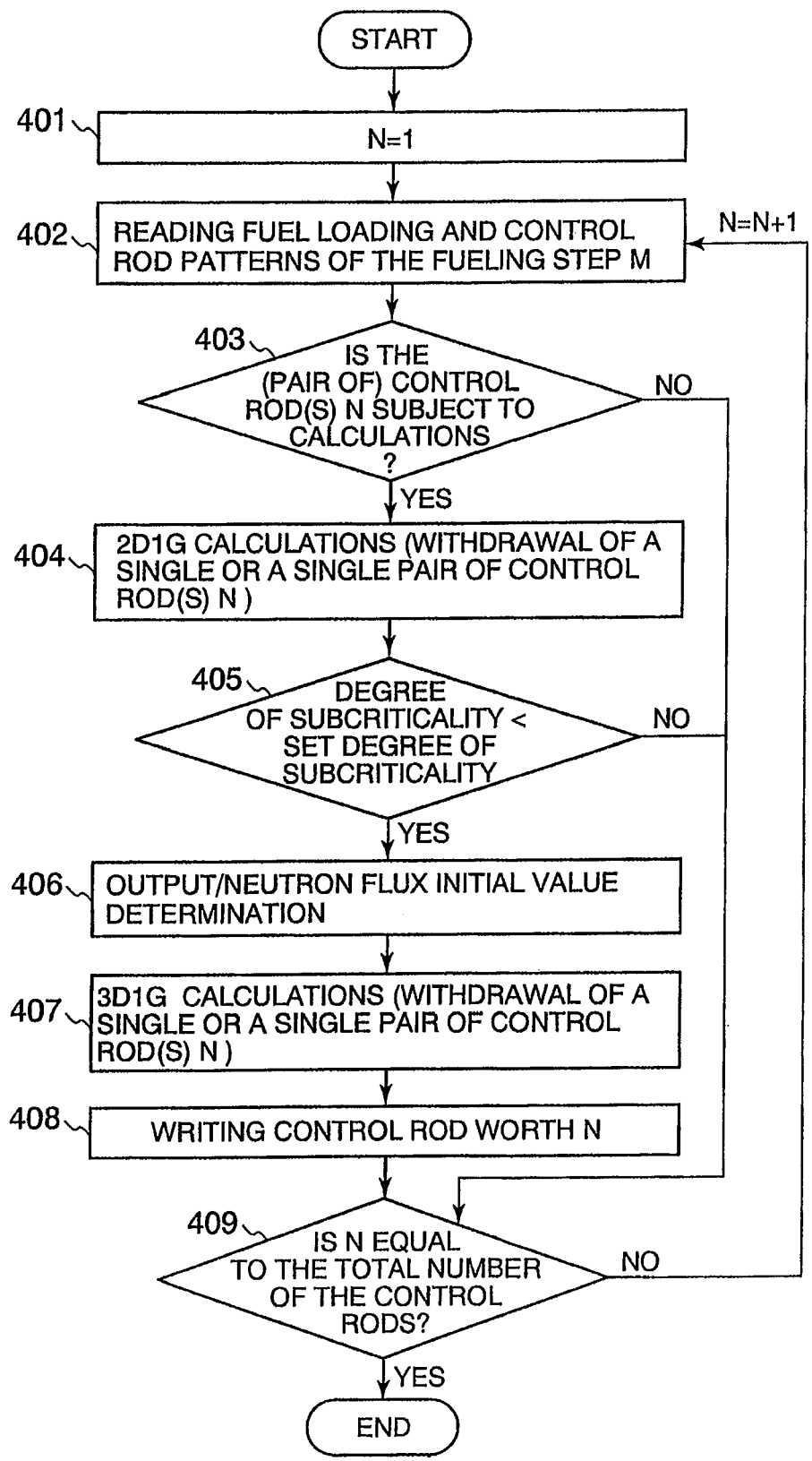
FIG. 4 is a flow chart for calculating control rod worth of each control rod of each fueling step M.

FIG. 4 shows details of Step 307 in FIG. 3. FIG. 4 shows a flow chart in which whether or not control rod worth is needed to be calculated is decided for all the control rods in each fueling step M and then control rod worth of all the number of control rods that is needed to be calculated is calculated. Brief descriptions are as follows.

In calculations of control rod worth of each fueling step M, first, a count of a control rod number N is set to 1.

Then, fuel loading/control rod patterns of a fueling step M are read (Step 402).

Then, based on the calculation condition data from the calculation condition database 8, whether the control rod N is subject to control rod worth calculations is judged (Step 403).

At this point, in the present embodiment, the calculation condition data that judge whether the above control rod N is subject to control rod worth calculations employ the version that if the number of fuel-loaded assemblies in a cell is 3 or less, the control rod N is not subject to control rod worth calculations. For taking a control rod pair into consideration, the calculation condition data employs the data that if the number of fuel-loaded assemblies of the cell with more fuel-loaded assemblies, out of 2 cells, is 3 or less, the control rod pair N is not subject to control rod worth calculations.

In Step 403, in a case that the control rod or a pair of control rods N is judged as a subject of control rod worth calculations (Yes), the state in which a single control rod or a pair of control rods N is withdrawn in the reactor core state of the fueling step M is calculated with a 2-dimensional modified 1-group model (Step 404). The 2-dimensional modified 1-group model is read from the reactor-core-simulator-calculation nuclear-model database 7.

Then, whether or not the degree of subcriticality of the reactor core provided as a part of the calculation results in Step 404 satisfies a set degree of subcriticality that sufficient maintainability is anticipated is judged (Step 405).

In Step 404, in a case that the degree of subcriticality of the reactor core in a state that a single control rod or a pair of control rods N is withdrawn does not satisfy the set degree of subcriticality that sufficient maintainability is anticipated (Yes), calculations of a neutron flux initial value are provided as a product of the neutron flux in Step 306 of FIG. 3 multiplied by a normalized flux of neutron calculated in Step 404 in FIG. 4 (Step 406). In this connection, in the present embodiment, regarding the value of the neutron flux in Step 306 of FIG. 3 multiplied by a normalized flux of neutron calculated in Step 404, in essence it only requires that the influence of a control rod or a pair of control rods N being withdrawn, calculated with a simple physics model, is reflected in the state in which all the control rods are inserted, calculated with a moderately subdivided physics model, and instead of multiplication, appropriate algebraic calculation can also be employed.

After calculating a neutron flux initial value by Step 406, the reactor core state in which a control rod or a pair of control rods N is withdrawn is calculated with a 3-dimensional modified 1-group model, using said neutron flux initial value (Step 407).

Then, the degree of subcriticality of the reactor core, calculated in Step 306 of FIG. 3, (i.e., the degree of subcriticality of the reactor core in a state that all the control rods are inserted), is compared to the degree of subcriticality of the reactor core in a state that a single control rod or a pair of control rods N is withdrawn, calculated in the above Step 407, and control rod worth of the control rod or pair of control rods N is calculated and written into the operation memory 9 (Step 408).

Then, whether "N" of the control rod or the pair of control rods is equal to the number of all the control rods is decided (Step 409).

In a case that the control rod or the pair of control rods N is not decided as a subject of calculations (No) in Step 403, and a case that the degree of subcriticality cannot be decided as smaller enough than a set degree of subcriticality (No) in Step 405, whether "N" of the control rod or pair of control rods N is equal to the number of all the control rods is decided directly in Step 409, without calculating control rod worth (Step 409).

In Step 409, in a case that "N" of the control rod or pair of control rods N is equal to the number of all the control rods (Yes), the calculations are terminated, and in a case that "N" of the control rod or pair of control rods N is not equal to the number of all the control rods (No), N is added by 1 and processed back in Step 402.

As shown in the above description and FIG. 4, the fueling plan evaluating method according to the present invention decides whether control rod worth of all the control rods is needed to be calculated for each fueling step, and calculates control rod worth of control rods that are narrowed down to the rods that control rod worth is needed to be calculated, thereby achieving reduction of the total calculation time.

Moreover, in order to calculate control rod worth of each control rod, a moderately subdivided physics model is used to achieve reduction of the calculation time. Furthermore, upon calculating control rod worth using said moderately subdivided physics model, appropriate neutron flux initial values are calculated with a simple physics model, thereby achieving reduction of the calculations with the moderately subdivided physics model.

The description of a first embodiment of the present invention is provided hereinabove, and in the above first embodiment, control rod worth of all the control rods is calculated for all the fueling steps, and maximum worth control rod candidates are selected out of such calculations, and finally reactor shutdown margin for the maximum worth control rod candidates are calculated.

In other words, in the first embodiment, if sufficient reactor shutdown margin cannot be obtained as a result of finally calculating the reactor shutdown margin of the maximum worth control rod candidates, the fueling procedures are reconsidered and calculations are done once again from the first fueling step.

However, according to such a method, since in some cases sufficient reactor shutdown margin is being provided through an intermediate fueling step, calculating once again from the first fueling step results in inefficiency.

Given such circumstances, in a second embodiment of the present invention below, after calculating control rod worth in each fueling step, the reactor shutdown margin of said fueling step is immediately calculated, and if the reactor shutdown margin does not satisfy a set value, this fueling step, or a fueling step preceding this fueling step by several steps, is once again formulated, and calculations of reactor margin levels are once again performed.

Figure 5:
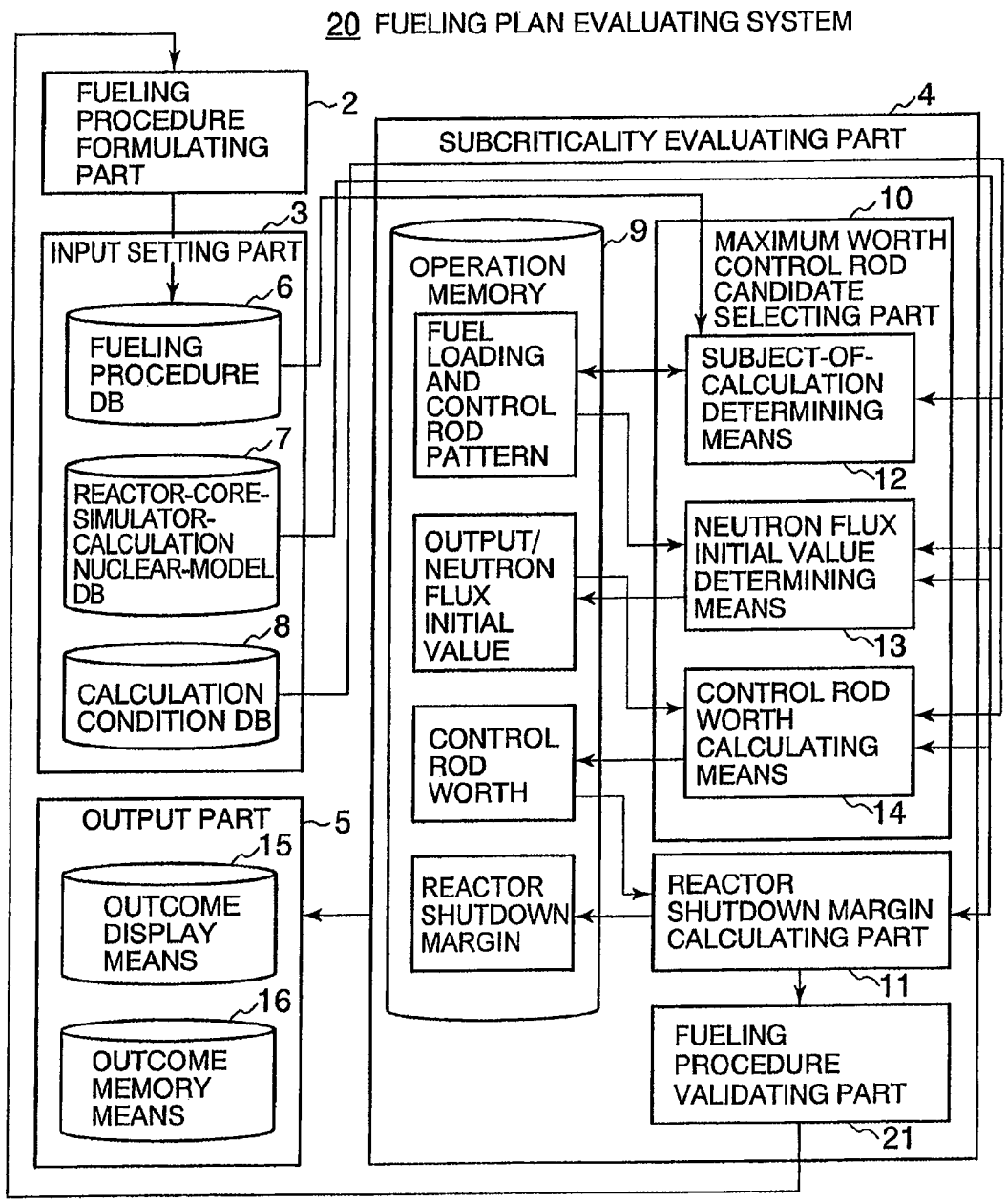
FIG. 5 is a system block diagram of a fueling plan evaluating system according to a second embodiment of the present invention.

FIG. 5 shows a constitution of the fueling plan evaluating system according to the above second embodiment of the present invention.

In FIG. 5, the identical reference numbers are applied to the parts identical to those in FIG. 1 to omit overlapping descriptions.

As shown in FIG. 5, a fueling plan evaluating system 20 of the present embodiment is identical to the fueling plan evaluating system 1 in FIG. 1 with the exceptions of comprising a fueling procedure validating part 21 and outputting a fueling procedure formulation request 22 from the fueling procedure validating part 21 to a fueling procedure formulating part 2.

Figure 6:
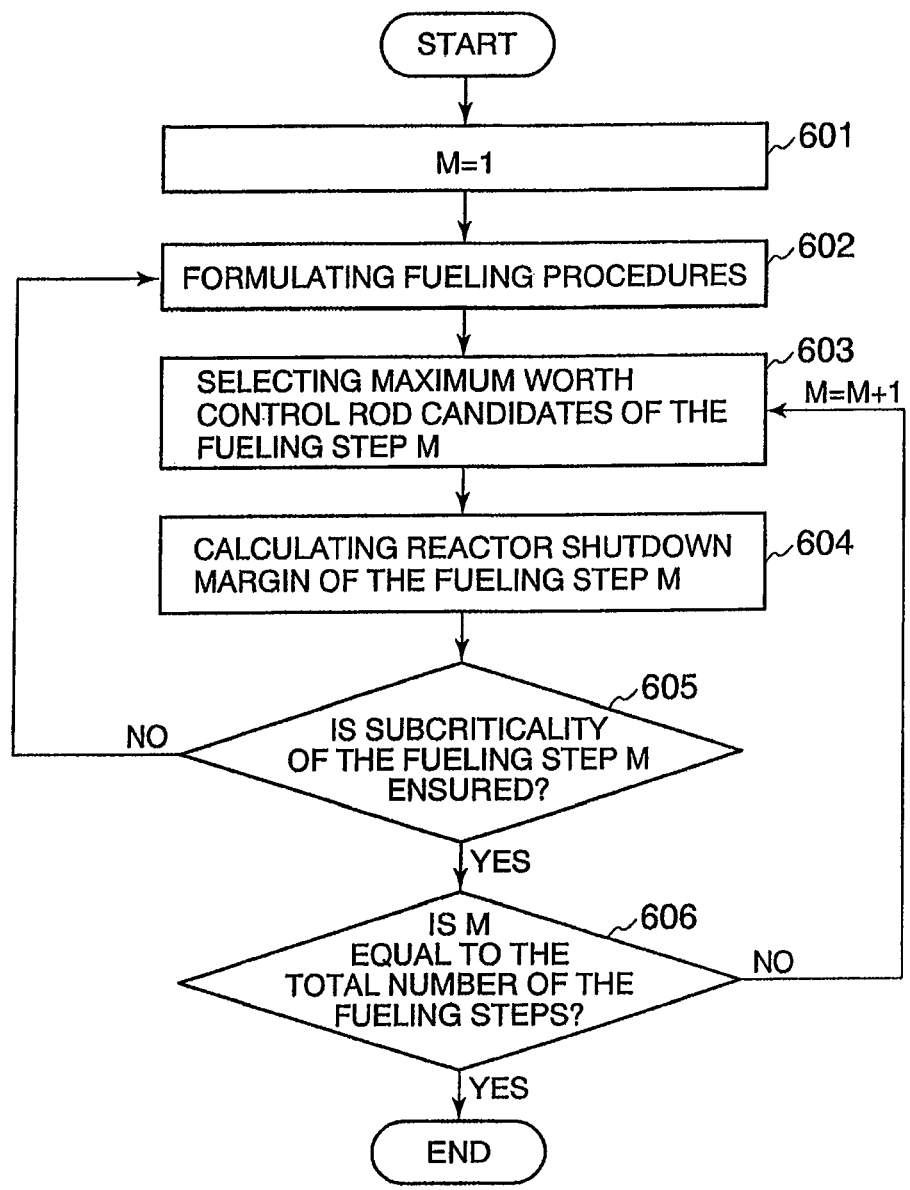
FIG. 6 is a flow chart showing a flow of processing in a fueling plan evaluating method according to a second embodiment of the present invention.
Figure 7:
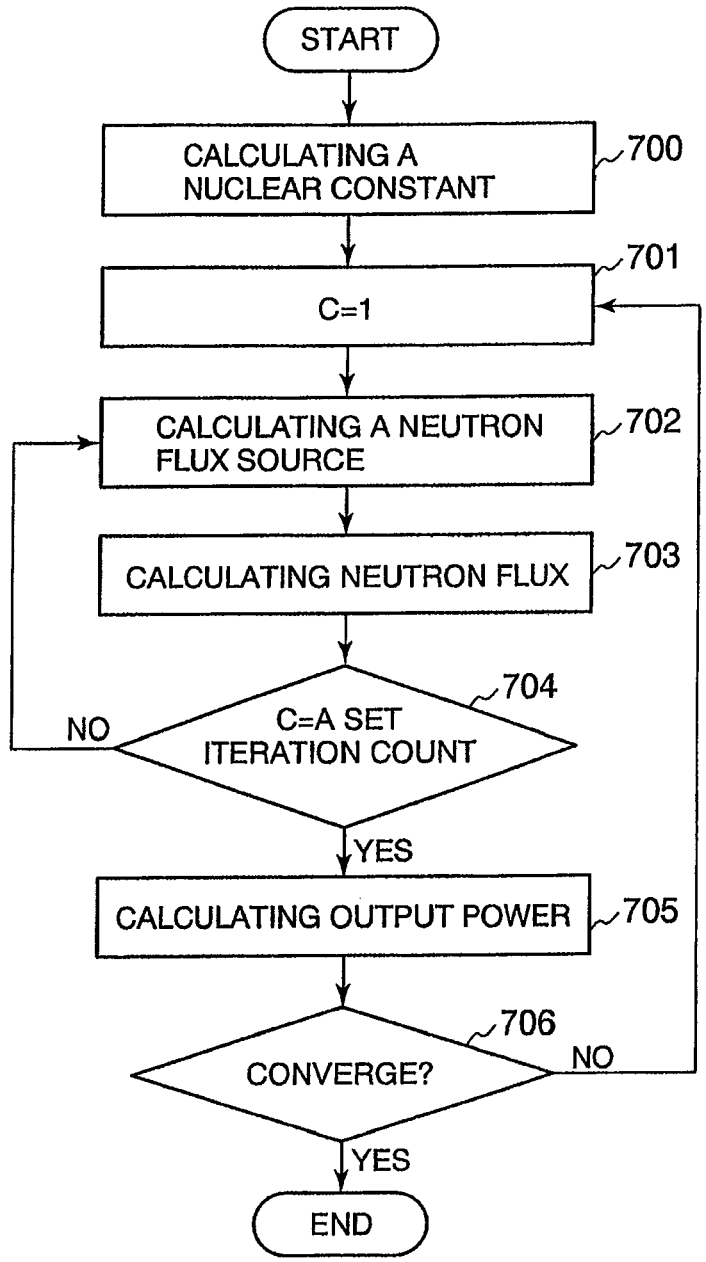
FIG. 7 is a flow chart showing a flow of processing of nuclear and thermal hydraulic coupling convergence calculations in a subcriticality evaluation with a reactor core simulator.

FIG. 6 shows a flow of processing in the second embodiment.

As shown in FIG. 6, in the fueling plan evaluating method of the second embodiment, a fueling step number M is set to 1 (Step 601), and all the fueling procedures in fuel displacement are formulated by the fueling procedure formulating part 2 (Step 602).

Then, by a maximum worth control rod candidate selecting part 10, maximum worth control rod candidates which constitute fueling procedures for the fueling step M are selected (Step 603).

The selecting method of the maximum worth control rod candidates is the same method in the first embodiment.

In the fueling plan evaluating method of the second embodiment, immediately after selecting the maximum worth control rod candidates for the fueling step M in Step 603, reactor shutdown margin of the fueling step, (i.e., for each fueling act M), is calculated (Step 604).

Then, in the fueling plan evaluating method of the second embodiment, whether the reactor shutdown margin calculated in Step 604 satisfies a design target value of reactor shutdown margin stored in a calculation condition database 8, (i.e., whether subcriticality is ensured in the fueling step M), is judged (Step 605).

This judgment is performed by the fueling procedure validating part 21.

The fueling procedure validating part 21 inputs a design target value of reactor shutdown margin from the calculation condition database 8 and inputs as well the reactor shutdown margin of a fueling step M from a reactor shutdown margin calculating part 11, and makes a comparison therebetween to judge whether or not subcriticality is ensured in the fueling step M.

In the fueling plan evaluating method of the second embodiment, in a case that subcriticality is judged not to be ensured in the fueling step M in the judgment in Step 605 (No), the fueling step number M and the calculation result in Step 605 are output to the fueling procedure formulating part 2, and the fueling procedure formulating part 2 is requested to re-formulate the fueling procedures.

That is, the fueling procedure formulation request 22 is transmitted from the fueling procedure validating part 21 to the fueling procedure formulating part 2.

Upon receipt of the fueling procedure formulation request 22, the fueling procedure formulating part 2 re-formulates the fueling procedures of the step immediately before or several steps before the fueling step M through the termination of the fuel displacement (Step 602). At this point, the fueling step number M is rewritten to give a newly formulated fueling step number.

In a case that the fueling procedure formulating part 2 re-formulates the fueling procedures from the fueling step M, the timing of the fueling step M formulated last time is adjusted. Additionally, if necessary, a comparison is made between the result of the calculations, to the fueling step M formulated last time, provided by the reactor shutdown margin calculating part 11 and the result of calculations calculated by the fueling procedure formulating part 2 with a simple model without performing convergence calculations, and, through statistical processing, revision of a simple model evaluation value when the fueling procedures are re-formulated by the fueling procedure formulating part 2 is determined.

The reason for calculating reactor shutdown margin per fueling step M as in the present embodiment is provided below.

Out of the fueling procedures formulated by the fueling procedure formulating part 2, in a case that reactor shutdown margin satisfies a design target value until a fueling step M−1 and the design target value of reactor shutdown margin is not satisfied in the fueling step M, the fueling procedures through a step immediately before the fueling step M or through a step several steps before the fueling step M involving the subcriticality decrease in the fueling step M can be employed as fueling procedures, but the procedures of the fueling step M+1 and the subsequent steps thereto cannot be employed as fueling procedures.

In the present embodiment, the calculation time is reduced by not calculating the fueling step M+1 and the subsequent steps that cannot be employed, and also by employing as fueling procedures the fueling steps that satisfaction of a design target value of reactor shutdown margin has been confirmed.

Also, by making a comparison between the result of the simple model calculations by the fueling procedure formulating part 2 through the fueling step M and the result of the calculations by the reactor shutdown margin calculating part 11 and then doing statistical processing, accuracy of the revised reactor shutdown margin evaluation with a simple model is improved, and the fueling procedures re-formulated by the fueling procedure formulating part 2 can be more efficient.

In the judgment in Step 605, in a case that it is judged that subcriticality is ensured in the fueling step M (Yes), whether the fueling step number M reaches the number of all the fueling steps is judged (Step 606).

If the fueling step number M reaches the number of all the fueling steps, the calculations are terminated, and if not, M is added by 1 count and the processing is repeated from Step 602.

Note that, in the second embodiment of the present invention, in a case that a formulated fueling step does not satisfy a design target value, the simple model of the fueling procedure formulating part 2 is revised by doing statistical processing of the difference between the result of the simple model calculations of the fueling procedure formulating part 2 and the result of the calculations by the reactor shutdown margin calculating part 11 to improve accuracy, but in the same manner, simple model revision of the fueling procedures that satisfy a design target can be realized in the same constitution.

According to the second embodiment above, in addition to the effect of the first embodiment, the inefficient calculations for the fueling step M+1 and the subsequent steps thereto in which subcriticality cannot be ensured can be skipped, and also accuracy of the reactor shutdown margin evaluation with a simple model at the time of fueling procedure formulation can be improved, and thus more effective fueling procedures can be formulated, and a fuel planning system and method in which fuel displacement time can be reduced can be provided.

In the above description, the description was made specifically with a 3-dimensional 3-group model, a 3-dimensional modified 1-group model and a 2-dimensional modified 1-group model as a subdivided physics model for reactor core simulation, a moderately subdivided physics model, and a simple physics model, for easy understanding.

However, the present invention does not limit the models to a 3-dimensional 3-group model, a 3-dimensional modified 1-group model, and a 2-dimensional modified 1-group model in the present invention, but, in essence, provided that a physics model for finally calculating reactor shutdown margin for maximum worth control rod candidates is the most subdivided first physics model, a simpler second physics model compared to the first physics model may be used in calculating control rod worth, and a further simpler physics model than the second physics model may be used in the calculations of neutron flux initial values in control rod worth calculations.

By using a simpler second physics model compared to the first physics model in calculating control rod worth, selection of maximum worth control rod candidates can be done with sufficient accuracy, and also the calculation time can be reduced.

Additionally, by using a further simpler physics model than the second physics model in calculating neutron flux initial values, the calculations of neutron flux initial values can be dealt with sufficient accuracy, and also the calculation time can be reduced.

The invention claimed is:

1. A fueling plan evaluating system comprising:
   a fueling procedure formulating part configured to formulate fueling procedures of a nuclear reactor;
   an input setting part including:
      an input processing block to input and set values for calculations,
      a fueling procedure database configured to perform storage management of the fueling procedures formulated by said fueling procedure formulating part,
      a reactor-core-simulator-calculation nuclear-model database configured to store physics models for performing calculations through reactor core simulation, and
      a calculation condition database configured to store calculation conditions for performing at least one of control rod worth calculations and reactor shutdown margin calculations;
   a maximum worth control rod candidate selecting part including a control rod worth calculating unit configured to:
      input fuel loading and control rod patterns of each fueling procedure from said fueling procedure database,
      input a simpler second physics model, compared to a subdivided first physics model, the simpler second physics model to direct reactor shutdown margin calculations, from said reactor-core-simulator-calculation nuclear-model database,
      calculate, with said second physics model, from a difference between a degree of subcriticality of a reactor core in a state that all insertable control rods are inserted and a degree of subcriticality of the reactor core in a state that a focused single control rod or single pair of control rods is withdrawn, a control rod worth of said focused single control rod or single pair of control rods for each fueling procedure,
      calculate a control rod worth of a control rod or a control rod pair of each planned fueling procedure, and
      select a determined number of control rods or control rod pairs with large values of control rod worth as maximum worth control rod candidates;
   a reactor shutdown margin calculating part configured to:
      input the maximum worth control rod candidates selected by said control rod worth calculating unit,
      input a subdivided first physics model used for reactor shutdown margin calculations from said reactor-core-simulator-calculation nuclear-model database, and
      calculate, using said subdivided first physics model for reactor shutdown margin calculations, for each of the maximum worth control rod candidates, reactor shutdown margin in a case that, from the fuel loading and control rod patterns, a focused maximum worth control rod candidate is withdrawn; and
   an output part configured to accept the reactor shutdown margin calculated by said reactor shutdown margin calculating part, and configured to output or store said reactor shutdown margin as an evaluation of a fueling plan for a nuclear reactor.

2. A fueling plan evaluating system according to claim 1 wherein said maximum worth control rod candidate selecting part comprises:
   neutron flux initial value determining unit configured to:
      calculate a neutron flux initial value which is used when said control rod worth calculating unit calculates control rod worth;
      input a simpler third physics model compared to said first physics model from the reactor-core-simulator-calculation nuclear-model database,
      calculating, with said third physics model, neutron flux in a state that all control rods or all insertable control rods are inserted in each fueling step,
      inputting a further simpler fourth physics model compared to said third physics model from the reactor-core-simulator-calculation nuclear-model database,
      calculating, with said fourth physics model, neutron flux in a case that a focused control rod or control rod pair is withdrawn, and
      determining a neutron flux initial value by applying algebraic operations to the neutron flux, calculated with said third physics model, in a state that said control rods are inserted, using the neutron flux calculated with said fourth physics model.

3. A fueling plan evaluating system according to claim 2 wherein said calculation condition database includes a calculation condition datum that calculations of control rod worth with said second physics model is skipped if the degree of subcriticality, calculated with said simpler fourth physics model, in a case that a focused control rod or control rod pair is withdrawn is larger than a set degree of subcriticality, and
   said control rod worth calculating unit configured to:
      input the calculation condition datum of said control rod worth calculations to be skipped from said calculation condition database, and
      skip the calculations of control rod worth if the degree of subcriticality calculated with said fourth physics model is larger than the set degree of subcriticality of said calculation condition datum.

4. A fueling plan evaluating system according to claim 2 wherein said third physics model and fourth physics model are a 3-dimensional modified 1-group model and a 2-dimensional modified 1-group model, respectively.

5. A fueling plan evaluating system according to claim 1 wherein said calculation condition database includes data of calculation conditions that if the number of fuel-loaded assemblies in a cell is 3 or less, the control rod is not subject to control rod worth calculations and that, for a control rod pair, if the number of fuel-loaded assemblies of the cell with more fuel-loaded assemblies, out of 2 cells, is 3 or less, the control rod pair is not subject to control rod worth calculations, and said control rod worth calculating unit is for:
   inputting said data of calculation conditions which are not subject to control rod worth calculations from the calculation condition database, and
   skipping the calculations of control rod worth for said control rod or control rod pair which is not subject to the calculations of control rod worth.

6. A fueling plan evaluating system according to claim 1 wherein said calculation condition database includes calculation condition data that convergence judgment of the calculations of control rod worth of a control rod or control rod pair is relaxed, said control rod or control pair being in a field where a relative value of an output power is equal to or lower than a standard value, and said control rod worth calculating unit configured to:
input calculation condition data of convergence judgment relaxation from said calculation condition database, and
relax the convergence judgment in the control rod worth calculations in a field where a relative value of an output power is equal to or lower than a standard value.

7. A fueling plan evaluating system according to claim 1 wherein said first physics model and second physics model are a 3-dimensional 3-group model and a 3-dimensional modified 1-group model, respectively.

8. A fueling plan evaluating system comprising:
a fueling procedure formulating part configured to formulate fueling procedures for fueling a nuclear reactor;
input setting part including:
an input processing block to input and set values for calculations,
a fueling procedure database configured to perform storage management of the fueling procedures formulated by said fueling procedure formulating part,
a reactor-core-simulator-calculation nuclear-model database configured to store physics models for performing calculations through reactor core simulation, and
a calculation condition database configured to store calculation conditions for performing control rod worth calculations or reactor shutdown margin calculations;
a maximum worth control rod candidate selecting part including a control rod worth calculating unit configured to:
input fuel loading and control rod patterns of each fueling procedure from said fueling procedure database,
input a simpler second physics model, compared to a subdivided first physics model, the simpler second physics model to direct reactor shutdown margin calculations, from said reactor-core-simulator-calculation nuclear-model database,
calculate, with said second physics model, from a difference between a degree of subcriticality of a reactor core in a state that all insertable control rods are inserted and a degree of subcriticality of the reactor core in a state that a focused single control rod or single pair of control rods is withdrawn, a control rod worth of said focused single control rod or single pair of control rods for each fueling procedure,
calculate a control rod worth of a control rod or a control rod pair of a focused fueling act, and
select a determined number of control rods or control rod pairs with large values of control rod worth as maximum worth control rod candidates;
a reactor shutdown margin calculating part which is configured, after maximum worth control rod candidates of each fueling procedure are selected by said control rod worth calculating unit, to:
input the maximum worth control rod candidates of each fueling procedure,
input a subdivided first physics model used for reactor shutdown margin calculations from said reactor-core-simulator-calculation nuclear-model database, and
calculate, using said subdivided first physics model for reactor shutdown margin calculations, for the maximum worth control rod candidates of each fueling procedure, reactor shutdown margin in a case that, from the fuel loading and control rod patterns, a focused maximum worth control rod candidate is withdrawn; and a fueling procedure validating part configured to:
input the reactor shutdown margin of each fueling procedure calculated by said reactor shutdown margin calculating part,
input a design target value of reactor shutdown margin from the calculation condition database,
compare the reactor shutdown margin to the design target value to judge whether or not subcriticality is ensured in said each fueling procedure, and
if subcriticality is decided not to be ensured in a fueling act, output a request to said fueling procedure formulating part to:
re-formulate the fueling act or
re-formulate a fueling act preceding the fueling act by a determined number of acts.

9. A fueling plan evaluating method comprising:
formulating fueling procedures for a nuclear reactor;
inputting fuel loading and control rod patterns of each of said formulated fueling procedures;
inputting a simpler second physics model, compared to a subdivided first physics model, configured to direct reactor shutdown margin calculations;
calculating according to said second physics model, from the difference between a degree of subcriticality of a reactor core in a state that all insertable control rods are inserted and a degree of subcriticality of the reactor core in a state that a focused single control rod or a single pair of control rods is withdrawn, a control rod worth of said focused single control rod or single pair of control rods for each fueling act;
calculating control rod worth of a control rod or a control rod pair of each planned fueling act;
selecting a determined number of control rods or control rod pairs with large values of control rod worth as maximum worth control rod candidates;
inputting said calculated maximum worth control rod candidates;
inputting a subdivided first physics model used for reactor shutdown margin calculations;
calculating, using said subdivided first physics model, for each of the maximum worth control rod candidates, reactor shutdown margin in a case that, from the fuel loading and control patterns, a focused maximum worth control rod candidate is withdrawn;
inputting said calculated reactor shutdown margin; and
outputting or storing said reactor shutdown margin as an evaluation of a fueling plan for a nuclear reactor.

10. A fueling plan evaluating method according to claim 9 comprising:
before the act of calculating control rod worth of said each control rod or control rod pair, inputting a simpler third physics model, compared to said first physics model, and calculating with said third physics model neutron flux in a state that all control rods or all insertable control rods are inserted in each fueling step;
inputting a further simpler fourth physics model, compared to said third physics model, and calculating with said fourth physics model neutron flux in a case that a focused control rod or control rod pair is withdrawn; and
determining a neutron flux initial value by applying algebraic operations to the neutron flux, calculated with said third physics model, in a state that said control rods are inserted, using the neutron flux calculated with said fourth physics model.

11. A fueling plan evaluating method according to claim 10 comprising:
preparing a calculation condition datum that the control rod worth calculated with said second physics model is skipped if the degree of subcriticality, calculated with said simpler fourth physics model, in a case that a focused control rod or control rod pair is withdrawn, is larger than a set degree of subcriticality; and
in said step of calculating control rod worth and selecting maximum worth control rod candidates:
inputting the calculation condition datum of said control rod worth calculations to be skipped, and
skipping the control rod worth calculations if the degree of subcriticality calculated with said fourth physics model is larger than the set degree of said calculation condition datum.

12. A fueling plan evaluating method according to claim 10 wherein said third physics model and fourth physics model are a 3-dimensional modified 1-group model and a 2-dimensional modified 1-group model, respectively.

13. A fueling plan evaluating method according to claim 9 comprising:
preparing data of calculation conditions:
that if the number of fuel-loaded assemblies in a cell is 3 or less, the control rod is not subject to control rod worth calculations, and
that for a control rod pair, if the number of fuel-loaded assemblies of the cell with more fuel-loaded assemblies, out of 2 cells, is 3 or less, the control rod pair is not subject to control rod worth calculations; and
in said act of calculating control rod worth and selecting maximum worth control rod candidates:
inputting said data of calculation conditions which are not subject to control rod worth calculations, and
skipping the calculations of control rod worth for said control rod or control rod pair which is not subject to the calculations of control rod worth.

14. A fueling plan evaluating method according to claim 9 comprising:
preparing calculation condition data that convergence judgment of the calculations of control rod worth of a control rod or control rod pair is relaxed, said control rod or control pair being in a field where a relative value of an output power is equal to or lower than a standard value, and
in said step of calculating control rod worth and selecting maximum worth control rod candidates:
inputting the calculation condition data of said convergence judgment relaxation, and
relaxing the convergence judgment in the control rod worth calculations in a field where a relative value of an output power is equal to or lower than a standard value.

15. A fueling plan evaluating method according to claim 9 wherein said first physics model and second physics model are a 3-dimensional 3-group model and a 3-dimensional modified 1-group model, respectively.

16. A fueling plan evaluating method comprising:
formulating fueling procedures for fueling a nuclear reactor;
inputting fuel loading and control rod patterns of each of said formulated fueling steps;
inputting a simpler second physics model, compared to a subdivided first physics model, configured to direct reactor shutdown margin calculations;
calculating according to said second physics model, from the difference between a degree of subcriticality of a reactor core in a state that all insertable control rods are inserted and a degree of subcriticality of the reactor core in a state that a focused single control rod or single pair of control rods is withdrawn, a control rod worth of said focused single control rod or single pair of control rods for each fueling act;
calculating a control rod worth of a control rod or a control rod pair of a focused fueling act;
selecting a determined number of control rods or control rod pairs with large values of control rod worth as maximum worth control rod candidates;
after maximum worth control rod candidates of said each fueling step are selected, inputting the maximum worth control rod candidates of each fueling act;
inputting a subdivided first physics model used for reactor shutdown margin calculations;
calculating using said subdivided first physics model, for the maximum worth control rod candidates of each fueling act, reactor shutdown margin in a case that, from the fuel loading and control patterns, a focused maximum worth control rod candidate is withdrawn;
inputting said calculated reactor shutdown margin of each fueling act;
comparing the reactor shutdown margin to a design target value of reactor shutdown margin and judging by the comparing whether or not subcriticality is ensured in said each fueling act, and
if subcriticality is decided not to be ensured in a fueling act,
re-formulating said fueling act or
re-formulating a fueling act preceding said fueling act by a determined number of acts.

* * * * *